US007449975B2

(12) United States Patent
Hoover

(10) Patent No.: US 7,449,975 B2
(45) Date of Patent: Nov. 11, 2008

(54) ULTRA WIDE BANDWIDTH BALUN

(75) Inventor: John C. Hoover, Amelia Island, FL (US)

(73) Assignee: EMS Technologies, Inc., Norcross, GA (US)

( * ) Notice: Subject to any disclaimer, the term of this patent is extended or adjusted under 35 U.S.C. 154(b) by 145 days.

(21) Appl. No.: 11/623,554

(22) Filed: Jan. 16, 2007

(65) Prior Publication Data

US 2007/0170998 A1 Jul. 26, 2007

Related U.S. Application Data

(60) Provisional application No. 60/761,347, filed on Jan. 24, 2006.

(51) Int. Cl.
*H03H 5/00* (2006.01)

(52) U.S. Cl. ............................ 333/26; 333/25; 333/246

(58) Field of Classification Search ............. 333/25–26, 333/204, 245–246
See application file for complete search history.

(56) References Cited

U.S. PATENT DOCUMENTS

H1244 H * 10/1993 Evans ......................... 333/251
7,265,644 B2 * 9/2007 Floyd et al. ................... 333/26

* cited by examiner

*Primary Examiner*—Anh Q Tran
(74) *Attorney, Agent, or Firm*—King & Spalding

(57) ABSTRACT

A balun is a device for coupling together balanced and unbalanced electrical signals. An ultra-wide bandwidth balun can operate in a frequency band of more than 1.5 GHz to 26.5 GHz. The balun can be based upon a resistively loaded choke structure. The loading can be in the form of resistive cards or vanes. The vanes may be aligned with the electric field between the choke and an outer ground to prevent effective short circuits at points where the choke is half wavelength multiples in length. The resistive loading may also suppress higher order modes within the choke structure. The wideband balun can be very small to satisfy the tight space constraints of many modern communication applications. The balun may be fabricated using standard printed circuit board manufacturing techniques which may dramatically reduce production costs.

26 Claims, 14 Drawing Sheets

ULTRA WIDE BANDWIDTH BALUN

PRIORITY CLAIM TO PROVISIONAL APPLICATION

This application claims priority to provisional patent application entitled, "Ultra Wide Bandwidth Balun" filed on Jan. 24, 2006 and assigned U.S. Application Ser. No. 60/761,347. The entire contents of the provisional patent application mentioned above are hereby incorporated by reference.

TECHNICAL FIELD

The invention is generally directed to signal transmission systems requiring baluns for coupling balanced and unbalanced transmission lines. The invention relates more specifically to baluns in radio frequency (RF) applications where systems operate at extreme bandwidths and at RF or millimeter frequencies. The invention also relates to baluns with an integrated RF power splitting capability.

BACKGROUND OF THE INVENTION

A balun is a device designed to couple together balanced and unbalanced electrical signals. A balun can be considered a simple form of transmission line transformer. The most basic baluns use an actual transformer, with the unbalanced connection made to one winding, and the balanced to another. Other types of baluns use transmission lines of specific lengths, with no obvious transformer component. These are usually designed for narrow radio-frequency (RF) ranges where the lengths involved are some odd multiple of a quarter wavelength of the intended operating RF frequency. A common application of such a balun is in making a coaxial cable connection to a balanced antenna.

A balanced line or balanced signal pair is an RF transmission line that usually includes two conductors in the presence of a ground. The RF transmission line relies on balanced impedances to minimize interference. The RF signals on each line are typically the inverse of one another and each conductor is equally exposed to any external electromagnetic fields that may induce unwanted noise. The balanced line may be operated so that when the impedances of the two conductors at all transverse planes are equal in magnitude and opposite in polarity with respect to ground, the electrical currents in the two conductors are equal in magnitude and opposite in direction. These symetries can allow balanced lines to reduce the amount of noise per distance, which can enable longer cable runs. This is because electromagnetic interference will generally affect both signals the same way. Similarities between the two signals are automatically removed at the end of the transmission path when one signal is subtracted from the other. Balanced lines often also have electromagnetic shielding to reduce the amount of noise that may be introduced.

In contrast, an unbalanced line is a transmission line whose conductors have unequal impedances with respect to an electrical ground. Generally, in an unbalanced transmission line, one of the conductors is grounded.

Traditional narrow-band sleeve baluns generally use a quarter wavelength conductive cylinder. A coaxial (coax) cable is placed inside the conductive cylinder. At one end, the shielding braid of the coaxial cable is wired to the conductive cylinder while at the other end no connection is made between the cable and the conductive cylinder. The balanced end of the resulting balun is at the open end of the conductive cylinder, opposite from the end wired to the coax braid. At this point the coax cable separates into two conductors. One conductor is the center conductor separated from the braid, and the second conductor is the braid shielding of the cable or a connection to the braid. The quarter wavelength structure acts as a transformer converting the zero impedance at the end shorted to the braid to infinite impedance at the open end. This forces any current introduced by the balanced connection, such as a dipole antenna, to flow into the unbalanced coax connection as the infinite impedance of the cylinder prevents any currents from flowing on the outside of the coax cable. The conductive cylinder can be considered a choke structure. This type of balun is narrow-band or band-limited because the balun only functions well at odd multiples of quarter wavelengths. The baluns function particularly poorly at resonant frequencies (half wavelength multiples) where they may act as a short circuit.

In light of the bandwidth limitations of traditional narrow-band balun designs, there is a need for a balun system that operates over a very wide bandwidth and at millimeter RF frequencies. There is also a need in the art for a balun system that splits power splitter at the balanced end in order to support multiple balanced loads, such as multiple antenna elements. These wide bandwidth and power splitting qualities of a balun system are highly desirable in applications such as broadband, multiple-antenna communication systems.

SUMMARY OF THE INVENTION

The inventive broadband balun can comprise a loaded choke structure. The loading can be in the form of resistive cards or vanes. The vanes may be aligned with an electric field between the choke and an outer ground. The significance of this balun design is that it can support an ultra-wide RF bandwidth of more than 1.5 GHz to 26.5 GHz. Such an ultra wide band balun may be useful in many kinds of electronic systems for coupling balanced and unbalanced transmission lines over an extremely wide band of RF operating frequencies. A feed network of a wide band antenna is one exemplary application of this electronic component. For example, spread-spectrum techniques requiring a wide frequency bandwidth are becoming more common in communication systems.

Compared to traditional multi-octave baluns that are based on quarter wavelength transmission lines and are generally only capable of a ten-to-one bandwidth ratio, the inventive ultra wide band balun may operate at an eighteen-to-one bandwidth ratio. The design can utilize a lossy balun approach. When the impedance of a load attached to the balun has considerable reactance, this lossy balun design may be advantageous resulting in a system that is lossy by design. Such a system may be considered lossy because it expends a portion of the RF energy supplied to or through it. The lost energy is usually converted to heat, radiated, or dissipated in some way.

The invention may also provide resistive loading of its choke structure to prevent effective short circuits at points where the choke is a half wavelength multiple. The resistive loading may also suppress higher order modes within the choke structure. The resistive loading can be achieved with resistive cards, also referred to as vanes. The resistive loading may also be accomplished using a discrete resistor or an array of discrete resistors.

The inventive balun can be very small, on the order of 30 millimeters, to satisfy the tight space constraints of many modern communication applications. While the resistive vanes and the power splitting capability are two significant features of the technology, an additional feature of the invention is that it may be embodied using standard printed circuit board (PCB) manufacturing techniques. PCB manufacturing can be highly scalable and may dramatically reduce production costs.

DETAILED DESCRIPTION OF EXEMPLARY EMBODIMENTS

The inventive balun system can support an ultra wide bandwidth spanning over an eighteen-to-one bandwidth ratio. Additionally, a power splitter arrangement can be incorporated into the balun system allowing the balun system to be used in a one input, one output arrangement or a one input, two output arrangement.

The inventive balun system may provide solutions for two challenges in the design of baluns with extreme bandwidth operation. First, a problem with wideband choke baluns is that a choke that is near a quarter wavelength at the lowest operating frequency will be near a half wavelength for a frequency higher in the band. Such a choke will perform well at the quarter wavelength but very poorly at the half wavelength and is thus band limited. Second, at higher RF frequencies the resistive cards dampen out higher order modes in the choke to further extend the useful frequency range.

One exemplary embodiment of the inventive balun system uses stripline technology. Such a design may result in a compact component for electronic systems such as antenna feed networks. The design may also improve reliability and yield high repeatability for quality manufacturing at a reasonable cost while achieving superior bandwidth performance.

Like most electromagnetic systems, the inventive balun system can be used reciprocally. The balun system can work equally well converting a balanced signal to an unbalanced signal as it can converting an unbalanced signal to a balanced signal. Also, a dual output balun system can function as a signal combiner just as it can function as a power splitter.

Figure 1:
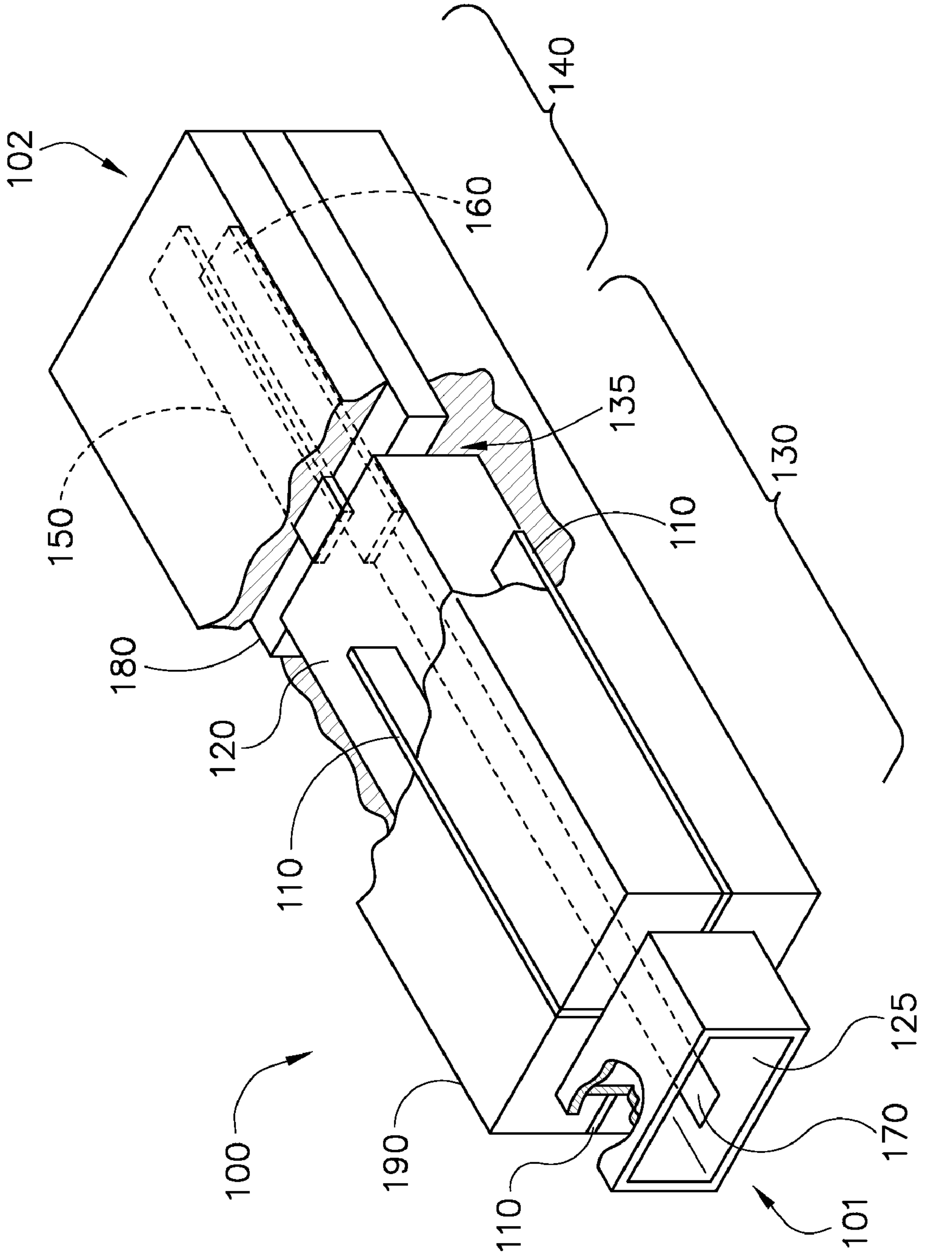
FIG. 1 illustrates a single input, single output wide-band balun using a stripline structure according to an exemplary embodiment of the invention.

Turning now to the drawings, in which like reference numerals refer to like elements, FIG. 1 illustrates a single input, single output wide-band balun system using a stripline structure according to an exemplary embodiment of the invention. An unbalanced single line input 101 to the balun 100 is formed from a stripline 170 surrounded by a loaded choke structure 120. A typical width of the stripline trace is approximately 0.050 inches. The loaded choke structure 120 is illustrated as a rectangular metal structure enclosing a dielectric material 125. The choke structure 120 can be characterized as "loaded" because it has resistive cards 110 or other resistive elements installed within the choke structure 120. The resistive cards 110, also called vanes, may each be oriented to extend outward from the outside wall of the choke structure 120 towards or to one or more inside surfaces of a grounded outer housing 190. The resistive cards 110 can be positioned such that they interact with the radio frequency electric field around the choke structure 120.

The resistive cards 110 are illustrated as a first vane 110 extending from the top of the choke structure 120, a second vane 110 extending from a side of the choke structure 120, and a third vane 110 extending from the other side of the choke structure 120. A fourth vane can be positioned on the bottom broad surface of the choke structure 120 which is not visible in FIG. 1.

The unbalanced input 101 transitions to a balanced output 102 with the input stripline 170 extending into one of the output striplines 160 at balanced output 102. The bottom output stripline 160 in the balanced section 140 is an extension of the narrower stripline 170 in the unbalanced section 130 of the balun 100. Similarly, the top stripline 150 at the balanced output 102 is an extension of the choke structure 120. Specifically, stripline 150 is an extension of the top metal wall of the choke structure 120.

The signals of the two striplines 150, 160 at output 102 are one-hundred-eighty degrees out of phase with each other. The grounded outer housing 190 of the balun 100 can be a metallized box that serves as the outer conductor, or ground of the choke 120 around the unbalanced line 170 in section 130 of the balun 100. The grounded outer housing 190 also serves as a shielding for the balance lines 150, 160 in section 140 of the balun 100. A transition takes place at a line 135 in the midpoint of the balun 100. This transition separates the unbalanced section 130 and balanced section 140 of the balun 100.

The resistive cards, or vanes 110 may be made from a thin dielectric film such as Mylar coated with a resistive film. Such a resistive film may have a continuous resistance, for example 100 ohms per square inch. The vanes 110 may also comprise a discrete resistor, an array of discrete resistors, or a bulk resistive material. Other card types may be used as well as other structures and other resistive values all without departing from the scope of the invention.

Figure 2:
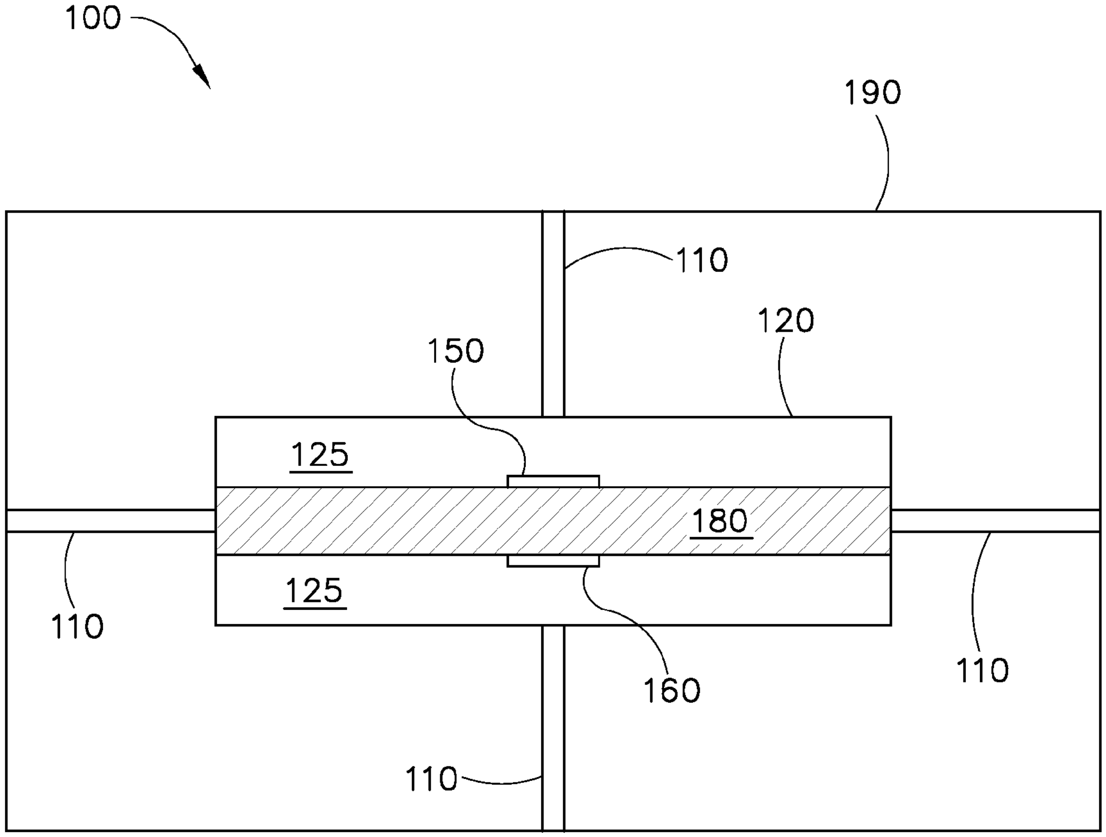
FIG. 2 illustrates a cross-sectional view of the balanced end of a resistively loaded choke balun implemented in stripline according to one exemplary embodiment of the invention.

Referring now to FIG. 2, the figure illustrates a cross-sectional view of the balanced end 102 of a resistively loaded choke balun implemented in stripline according to one exemplary embodiment of the invention. The balanced end 102 is shown with the upper stripline 150 and the lower stripline 160. The choke structure 120 can support the resistive vanes 110 that extend outward from the choke structure 120 to an outer ground 190. The resistive vanes 110 can be arranged radially. That is, the resistive vanes 110 can be in line with the center point of the choke structure 120 and normal to the outer surfaces of the choke structure 120. The dielectric circuit board 180 can support the striplines 150 and 160. The upper stripline 150 and the lower stripline 160 are spaced apart in a parallel fashion by the dielectric circuit board 180. The choke dielectric material 125 can fill the area within the choke body 120. The choke dielectric material 125 may be circuit board dielectric, some other dielectric, or air.

Figure 3:
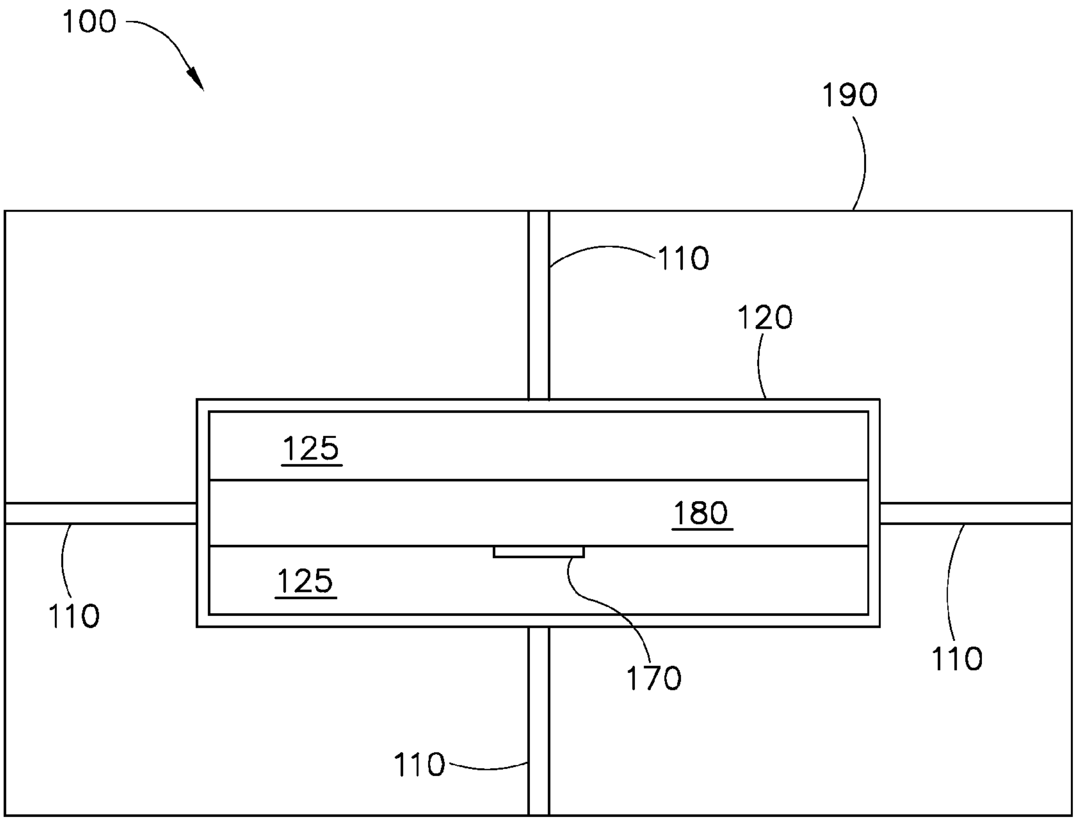
FIG. 3 illustrates a cross-sectional view of the unbalanced end of a resistively loaded choke balun implemented in stripline according to one exemplary embodiment of the invention.

Referring now to FIG. 3, the figure illustrates a cross-sectional view of the unbalanced end of a resistively loaded choke balun implemented in stripline according to one exemplary embodiment of the invention. The unbalanced end 101 is a single stripline 170 supported by printed circuit board 180 or other dielectric material 180. The choke structure 120 can support the resistive vanes 110 that extend outward from the choke structure 120 to an outer ground 190. The resistive vanes 110 can be arranged radially. That is, the resistive vanes 110 can be in line with the center point of the choke structure 120 and normal to the outer surfaces of the choke structure 120. The dielectric circuit board 180 can support the stripline 170. The choke dielectric material 125 can fill the area within the choke body 120. The choke dielectric material 125 may be circuit board dielectric, some other dielectric, or air.

Figure 4:
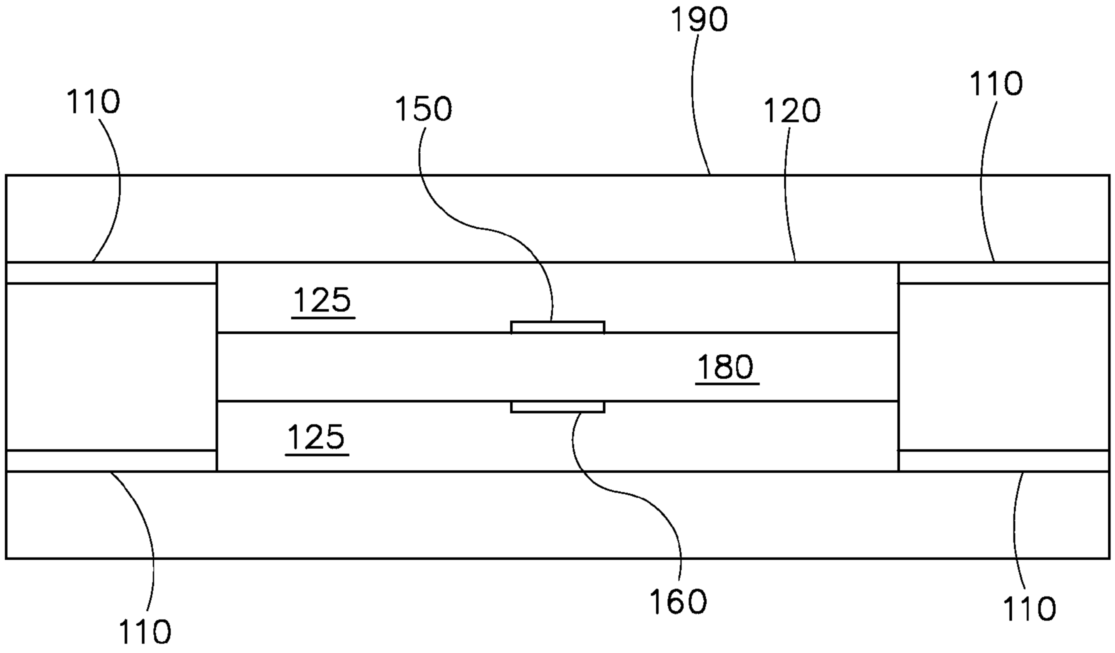
FIG. 4 illustrates a cross-sectional view of the balanced output of a stripline balun with non-radial vanes according to one exemplary embodiment of the invention.

Referring now to FIG. 4, the figure illustrates a cross-sectional view of the balanced output of a stripline balun with non-radial vanes according to one exemplary embodiment of the invention. The balanced end 102 is shown with the upper stripline 150 and the lower stripline 160. The choke structure 120 can support the resistive vanes 110 that extend outward from the choke structure 120 and normal to the surfaces of the choke structure 120. The resistive vanes 110 can extend out to an outer ground 190. The resistive vanes 110 can be arranged non-radially. That is, the resistive vanes 110 do not have to be positioned in line with the center point of the choke structure 120. The dielectric circuit board 180 can support the striplines 150 and 160. The upper stripline 150 and the lower stripline 160 are spaced apart in a parallel fashion by the dielectric circuit board 180. The choke dielectric material 125 can fill the area within the choke structure 120. The choke dielectric material 125 may be circuit board dielectric, some other dielectric, or air. Resistive vanes 110 extend outwardly from the choke structure 120. In this exemplary embodiment the resistive vanes may not extend off of the top and bottom of the choke structure. This exemplary embodiment demonstrates that the vanes can be placed as needed outside of the choke structure 120 to support ease of manufacturing and to reduce the unwanted modes of the electric fields within the balun. To be most effective, the resistive cards or vanes 110 may extend radially outward from the choke structure towards or to the grounded outer housing 190. However, as we see here, the vanes need not be exactly radial to function. For example, the vanes 110 may lie in a line substantially parallel to the electric fields.

Figure 5:
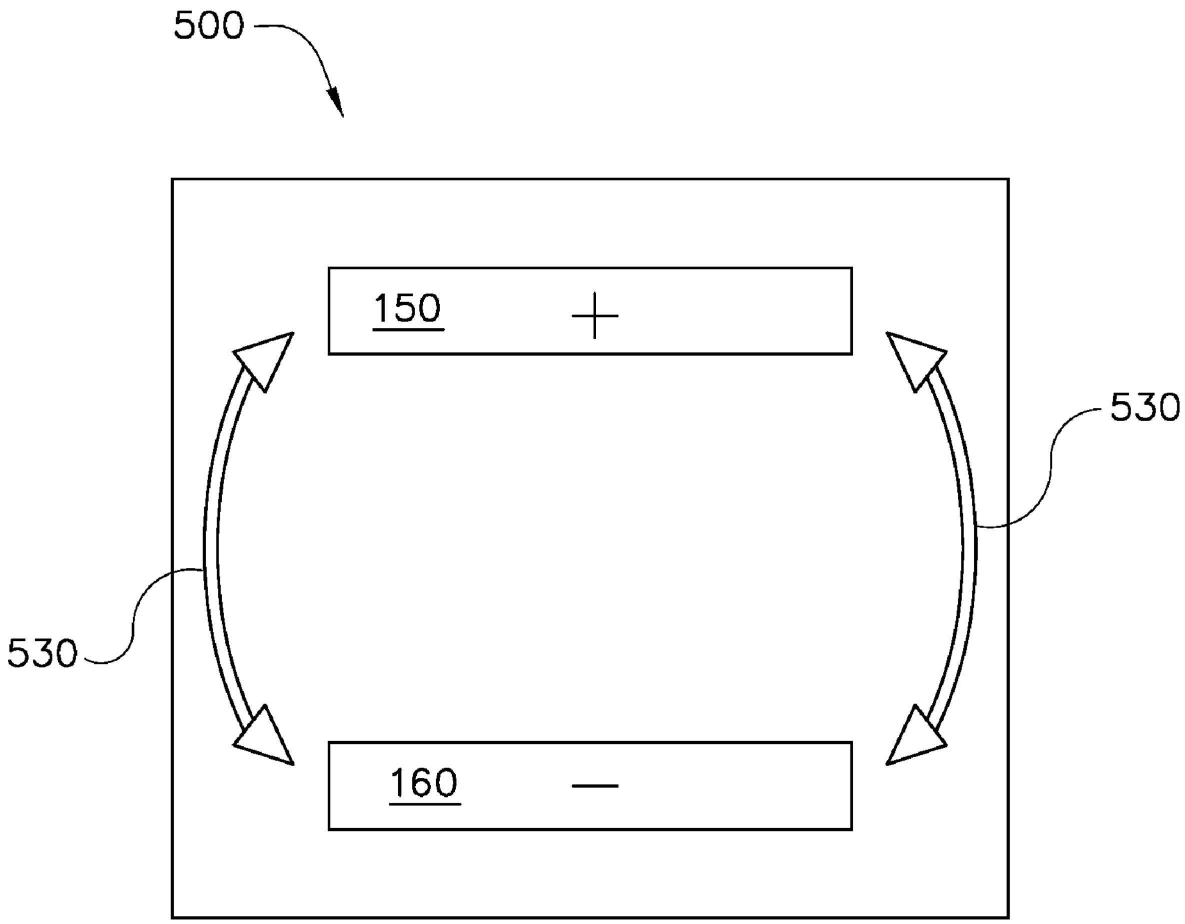
FIG. 5 illustrates balanced propagation within the cross-section of the balanced transmission line of the balun according to one exemplary embodiment of the invention.

Referring now to FIG. 5, the figure illustrates balanced propagation within the cross-section of the balanced transmission line of the balun according to one exemplary embodiment of the invention. The top conductive trace 150 and the bottom conductive trace 160 are at opposite potentials. The top conductive trace 150 is positive and the bottom conductive trace 160 is negative. Thus, there is an electric field 530 between the two conductors. This represents a balanced or odd mode of propagation. Such a mode is the desired mode for a balanced transmission line.

Figure 6:
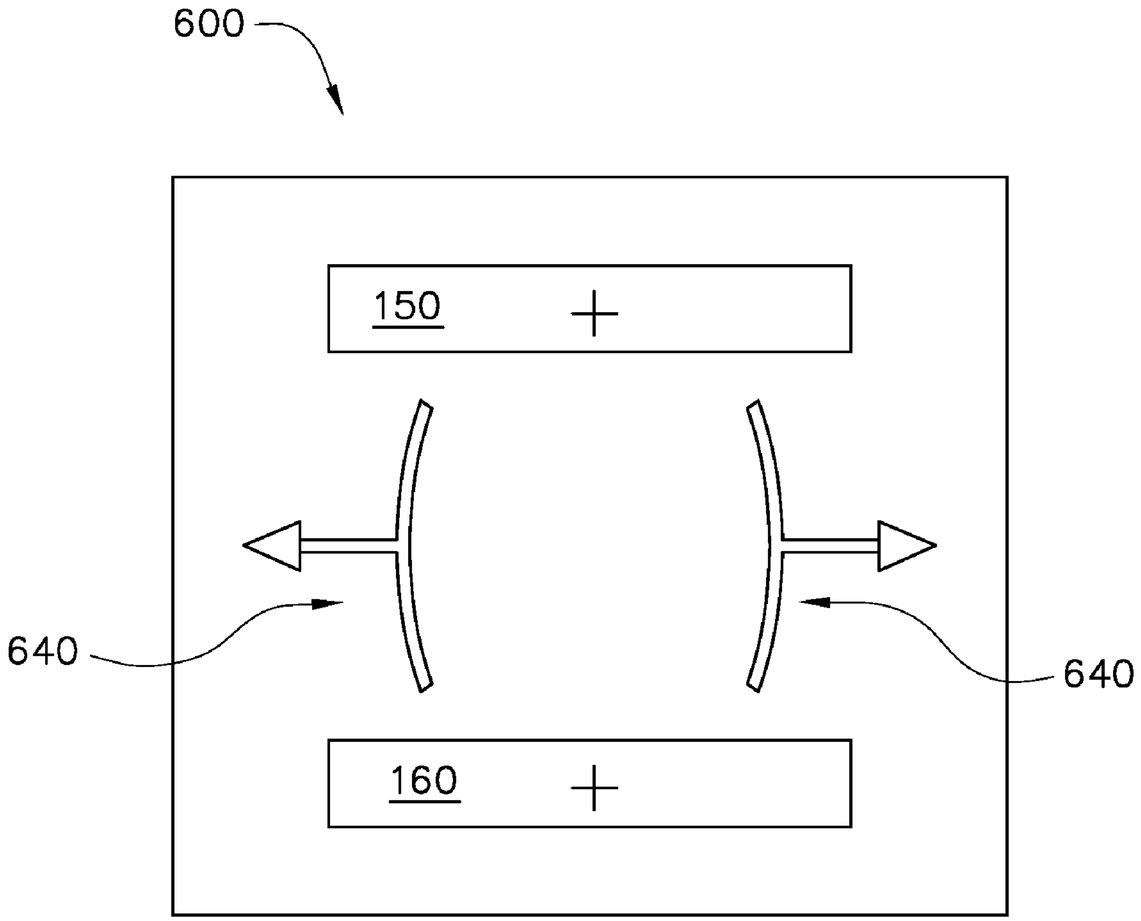
FIG. 6 illustrates unbalanced propagation within the cross-section of the balanced transmission line of the balun according to one exemplary embodiment of the invention.

Referring now to FIG. 6, the figure illustrates unbalanced propagation within the cross-section of the balanced transmission line of the balun according to one exemplary embodiment of the invention. Here, the top conductor 150 is positive, the bottom conductor 160 is also positive, no voltage potential exists between the two outputs, and the potential 640 is referenced to an outside ground not shown. This represents an even mode or unbalanced mode of propagation where. Such a mode is the undesired mode for a balanced transmission line.

Figure 7:
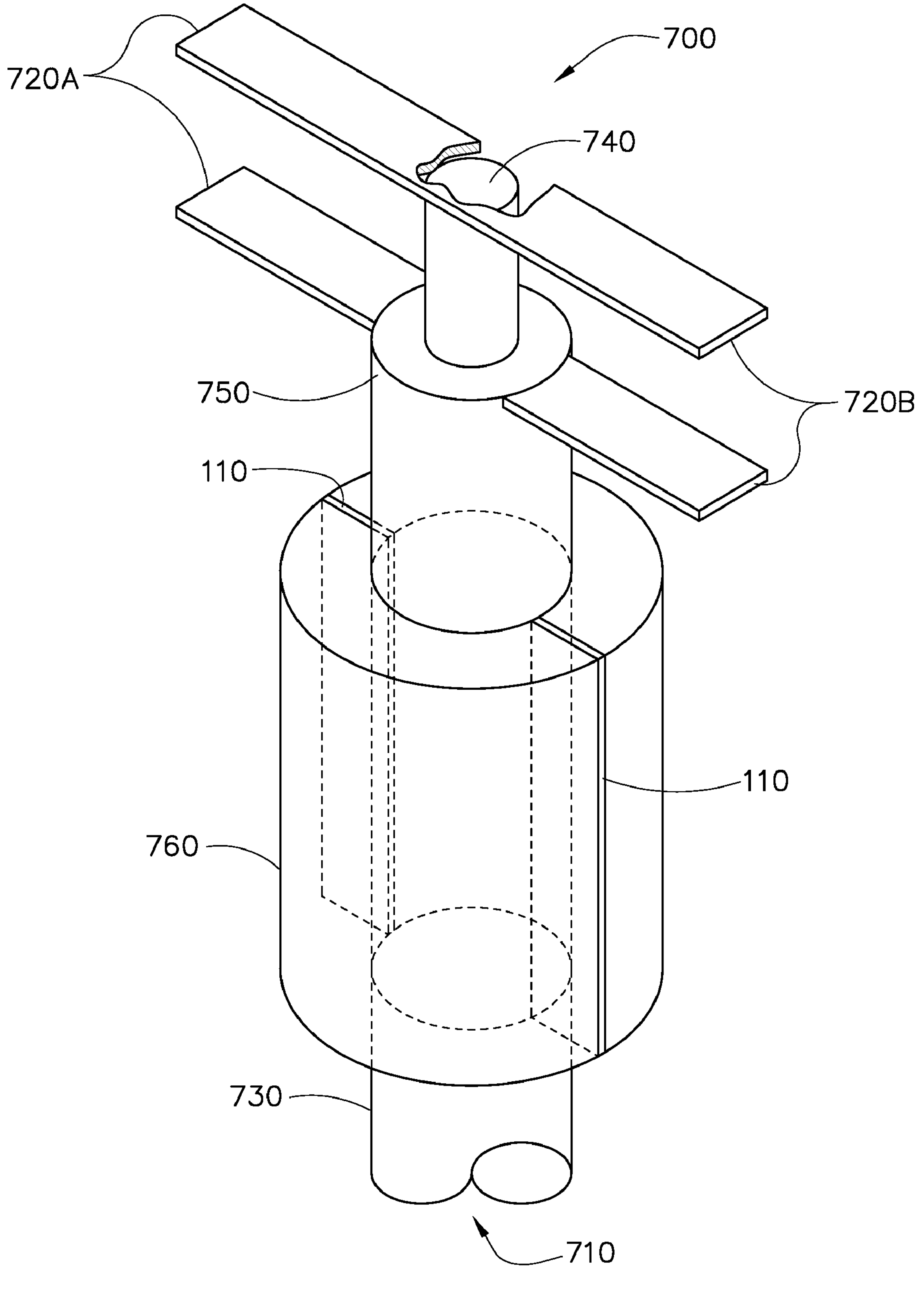
FIG. 7 illustrates a coaxial cable and a sleeve choke according to one exemplary embodiment of the invention.

Referring now to FIG. 7, the figure illustrates a coaxial cable and a sleeve choke according to one exemplary embodiment of the invention. Coaxial cable 730 comprises center conductor 740 and coaxial exterior shielding or braid 750. Sleeve choke structure 760 is a cylindrical conductor that can be placed coaxially around the coaxial cable 730 such that they share a common center line. Resistive vanes 110 can extend outwardly within the choke structure 760 from the braid 750 of the coaxial cable 730. The vanes 570 may extend outward from coaxial braid 750 to the cylindrical choke structure 760. A balanced output from the sleeve balun 700 is shown at 720A where center conductor of the coaxial cable 740 becomes one of the balanced conductors and the braid 750 of coaxial cable 730 becomes the other balanced conductor. There is also a power split where the balance output is split between one balanced pair 520A and a second balanced pair 520B.

Typically, the impedance at each of the two balanced outputs 720A, 720B may be twice that of the impedance of the input 710. In this example, the output impedance at each output is 100 ohms and the input impedance is 50 ohms. While a two-way power split is illustrated, the power split may also be an N-way power split without departing from the spirit or scope of the invention.

Figure 8:
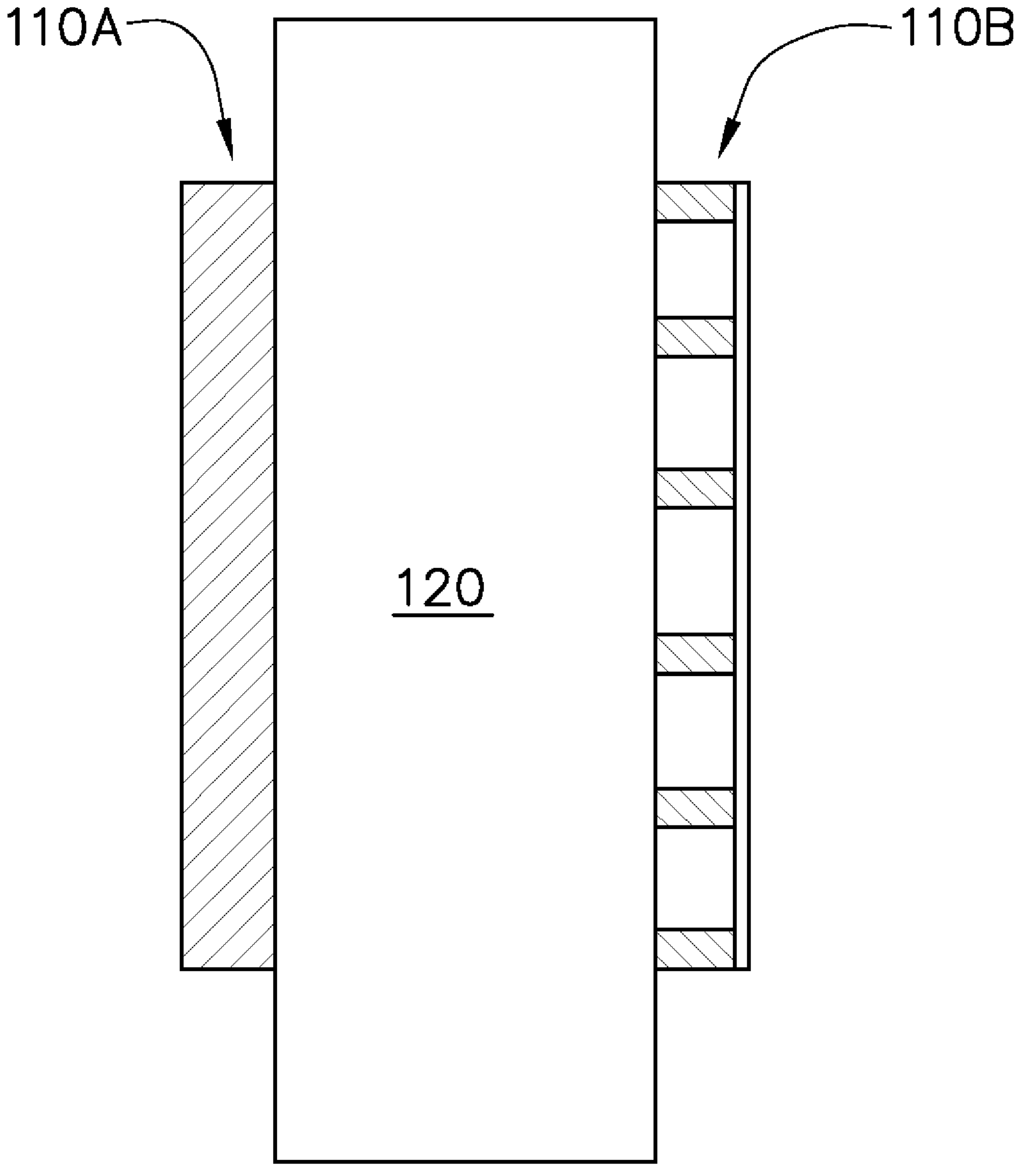
FIG. 8 illustrates how the resistive vanes can also be embodied as a set of resistors.

Referring now to FIG. 8, the figure illustrates how the resistive vanes 110A can also be embodied as a set of discrete resistors 110B. As discussed with reference to FIG. 1, the resistive vanes may also be embodied as a single discrete resistor, a resistive film, bulk resistive material, or any other mechanism for providing a resistive loading to the choke structure of the balun.

Figure 9:
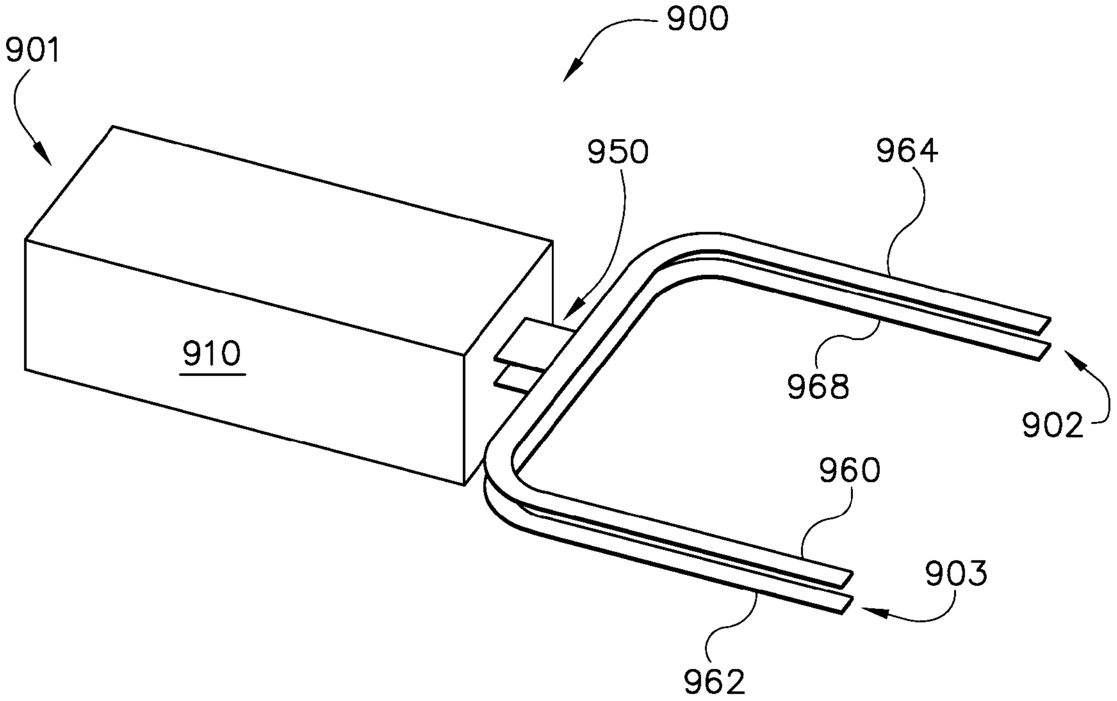
FIG. 9 illustrates a perspective view of a single input, dual output stripline balun featuring a power split according to one exemplary embodiment of the invention.
Figure 10:
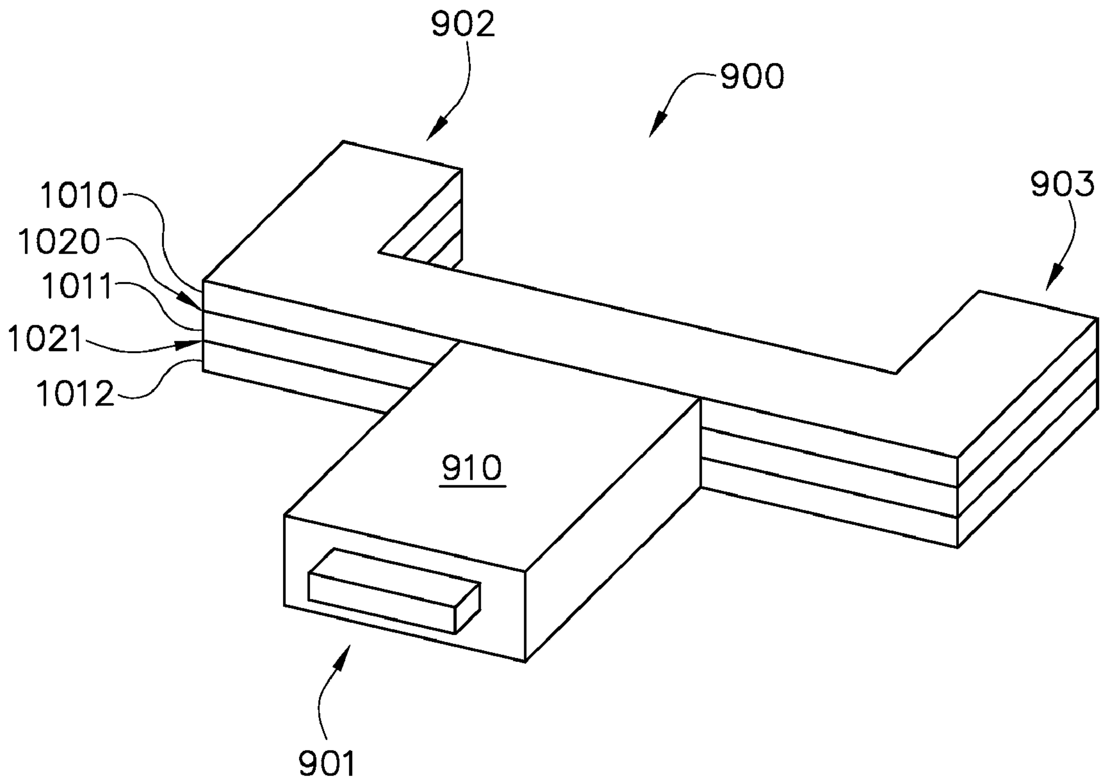
FIG. 10 illustrates a perspective view of a single input, dual output stripline balun featuring a power split according to one exemplary embodiment of the invention.

Referring now to FIG. 9 and FIG. 10 together, both figures illustrate perspective views of a single input, dual output stripline balun 900 featuring a power split according to one exemplary embodiment of the invention. The unbalanced input 901 is a single transmission line. The transmission line enters the rectangular choke structure 910. The rectangular choke structure 910 is similar to the choke structure 120 of FIG. 1. Resistive vanes (110, not illustrated) can extend beyond the outer surface of the choke structure 910 to an external ground conductor. The resistive vanes 110 may be substantially normal to the outer surfaces of the choke structure 910 and may be arranged radially as discussed with relation to FIG. 2, or non-radially as discussed with relation to FIG. 4. The choke structure 910 is in the unbalanced section of the balun 900. The unbalanced section of balun 900 may be substantially identical to the unbalanced portion 130 of a non-power-splitting stripline balun 100, such as those discussed in relation to FIGS. 1, 2, 3, and 4.

At the splitter location 950, the balanced end of the choke structure 910 can split out to service two balanced outputs 902, 903. A first balanced output 902 can be is fed by the balanced transmission line made up of an upper trace 964 and a low trace 968. A second balanced output 903 can be fed by the balanced transmission line made up an upper trace 960 and a lower trance 962. In the exemplary embodiment illustrated in FIG. 9, the two upper traces 964, 960 can split off of the upper portion of the choke structure 910, while the lower traces 968, 962 can split off of the single transmission line (not illustrated) within the choke structure 910. Such a splitting can provide for the two balanced outputs 902, 903 being in phase with one another. In another exemplary embodiment the upper traces 964,960 can split off of the center transmission line of the choke structure 910 while the lower traces 962, 968 can split off of the lower portion of the choke structure 910. In this second example, the splitting can provide for the two balanced outputs 902, 903 being in phase with one another but in opposite phase from the first example. In other exemplary embodiments, the balanced outputs 902, 903 can be out of phase from one another by one extending from the upper portion of the choke structure 910 and the other extending from the lower portion of the choke structure 910. Such an arrangement may require more printed circuit layers on the balanced end of the dual output balun 900.

The balanced end 902,903 of the balun system may be constructed of three dielectric layers, 1010, 1011, and 1012. The upper conductors 962, 964 of the balanced outputs 902, 903 can lie on the metallization layer 1020 positioned between the top dielectric layer 1010 and the second dielectric layer 1011. The lower conductors 962, 968 of the balanced outputs 902, 903 can lie on the metallization layer 1021 positioned between the second dielectric layer 1011 and the third dielectric layer 1012.

While a two-way power split is illustrated, the power split may also be an N-way power split without departing from the spirit or scope of the invention.

Figure 11:
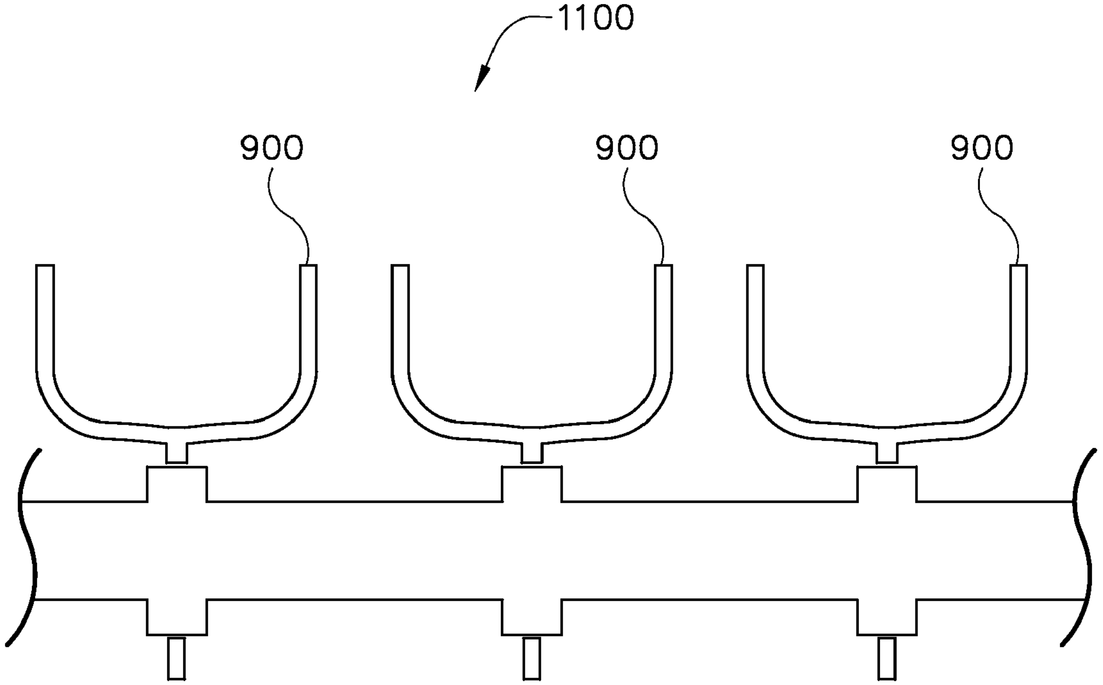
FIG. 11 illustrates a system of single input, dual output power splitting baluns arranged in a linear fashion to make up an RF power distribution system according to one exemplary embodiment of the invention.

Referring now to FIG. 11, the figure illustrates a system 1100 of single input, dual output power splitting baluns 900 arranged in a linear fashion to make up an RF power distribution system according to one exemplary embodiment of the invention. The distribution system 1100 shows a plurality of single input, dual output baluns 900. The baluns 900 are arranged in a linear fashion and connected by a rigid support structure. Multiple linear arrays 1100 may be arranged to form a two dimensional plane of balanced outputs.

Figure 12:
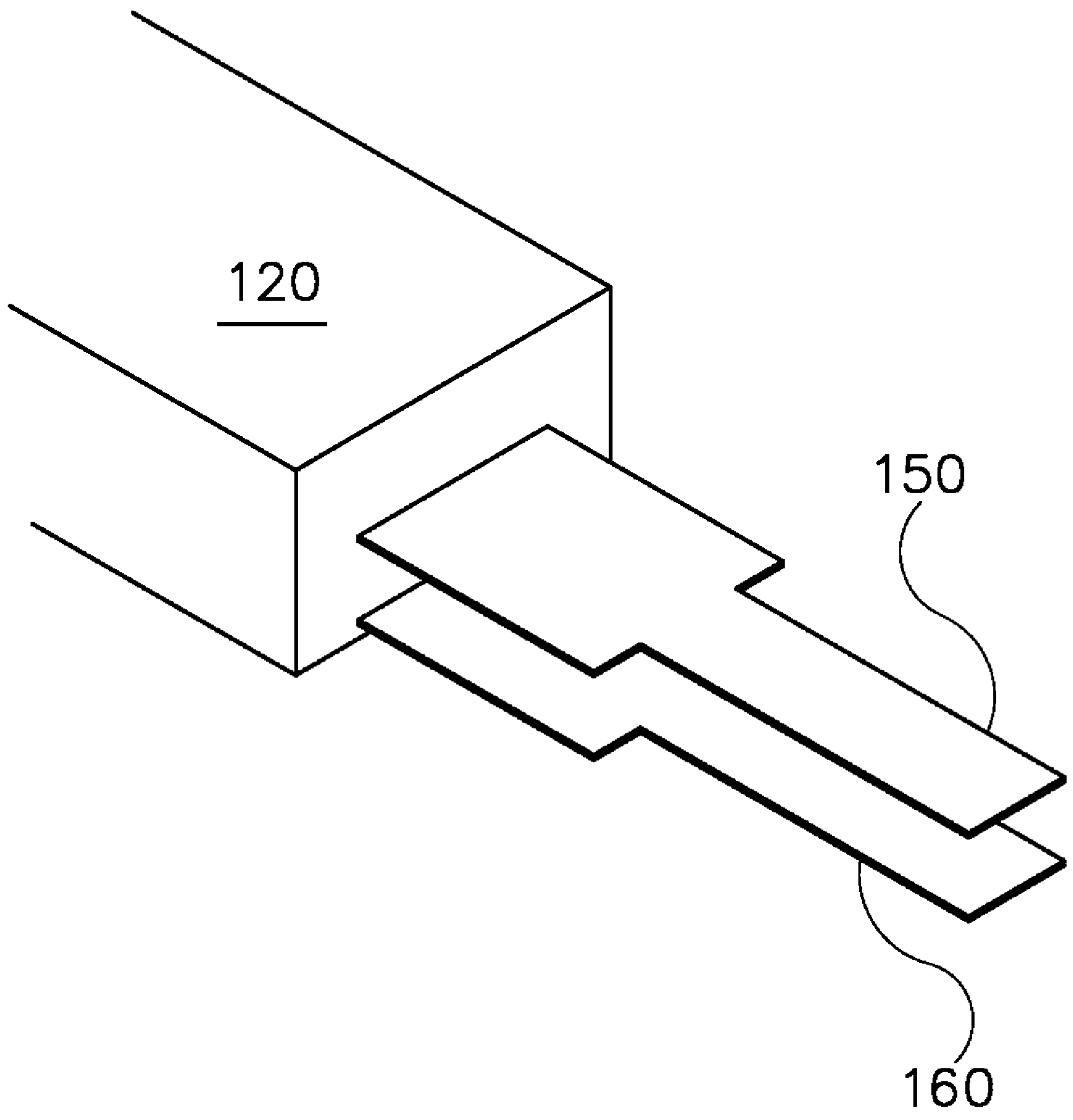
FIG. 12 illustrates a close up the unbalanced to balanced junction of a single input, single output stripline balun according to one exemplary embodiment of the invention.

Referring now to FIG. 12, the figure illustrates a close up the unbalanced to balanced junction of a single input, single output stripline balun according to one exemplary embodiment of the invention. Near the point where the unbalanced input trace 170 (not visible in FIG. 12) and one surface of the choke structure 120 extend to become the conductors 150, 160 of the balanced transmission line, a transition in the width of the trances may serve to match the impedance between the single unbalanced conductor and the balanced transmission line.

Figure 13:
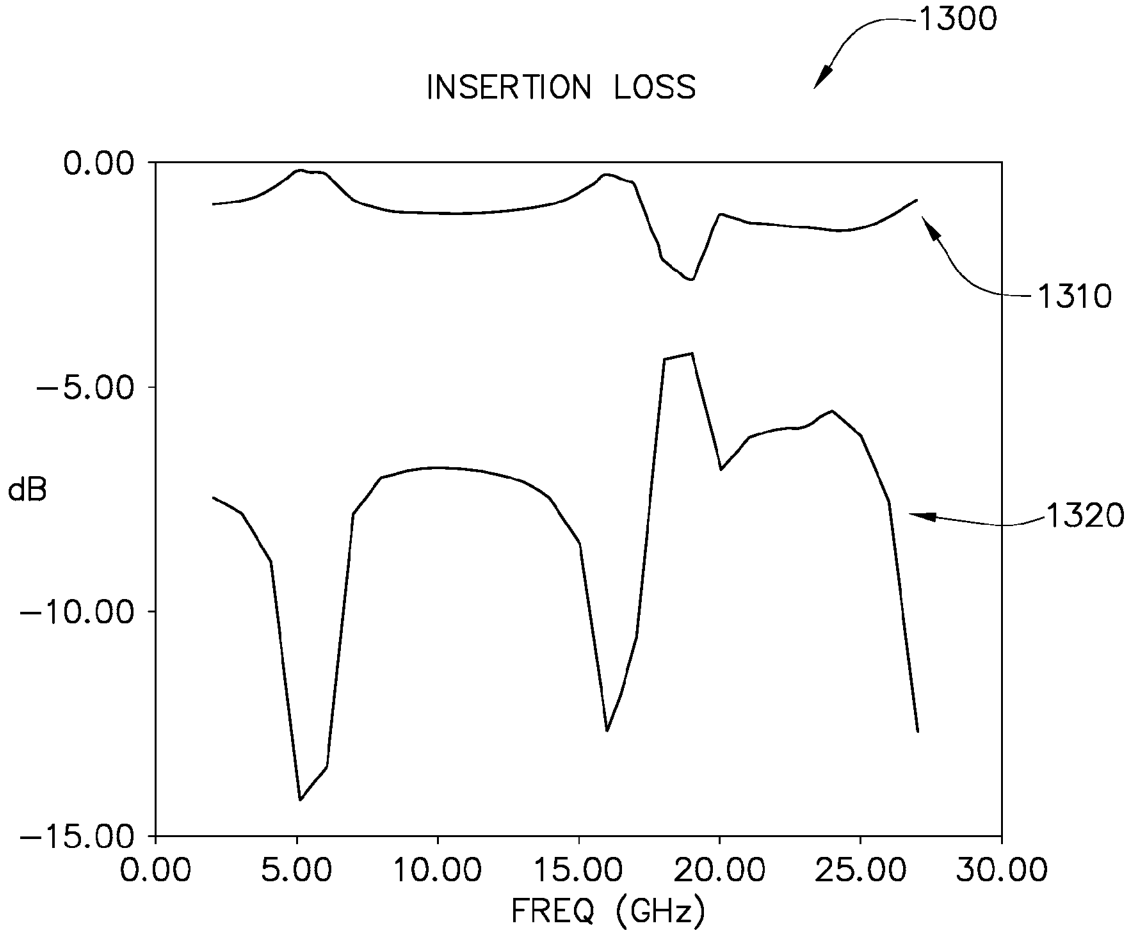
FIG. 13 is a plot of the insertion loss for a single input, single output balun loaded with resistive cards according to one exemplary embodiment of the invention.

Referring now to FIG. 13, the figure is a plot of the insertion loss for a single input, single output balun loaded with resistive cards according to one exemplary embodiment of the invention. The plot shows frequency in gigahertz (GHz) on the horizontal axis and power in decibels (dB) on the vertical axis. The top trace 1310 of the plot is the desired output signal at the balanced output port 102. This is the odd field between the output conductors. It is this odd, balanced, or transverse electromagnetic (TEM) mode that is the desired output. The bottom trace 1320 is the undesired output signal obtained by shorting out the two output conductors and measuring the voltage to the grounded outer housing. Electric fields exist between the pair and the outer ground surfaces. This is the undesired output signal of the unbalanced or the even mode.

Figure 14:
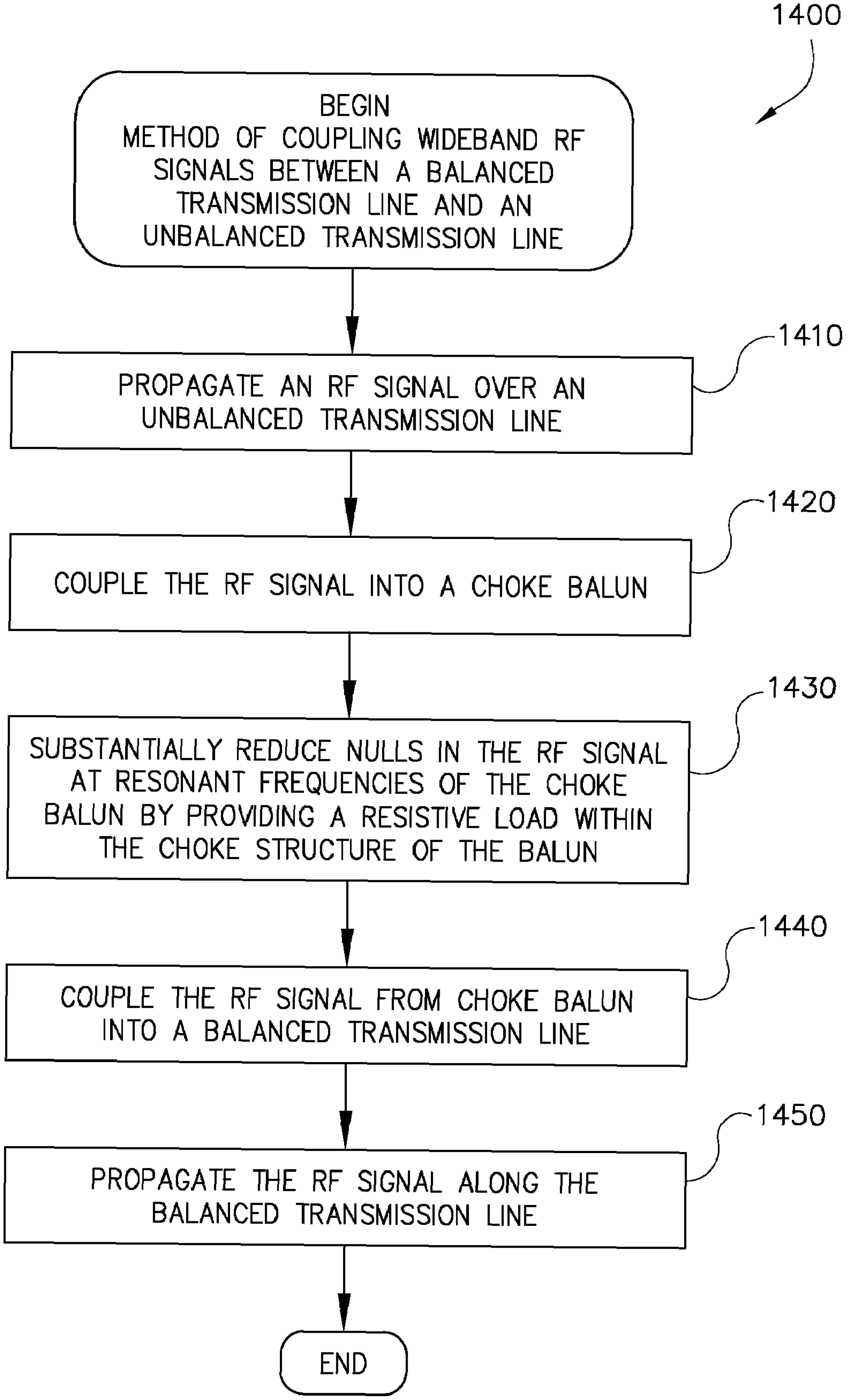
FIG. 14 is a logical flow diagram representing a method for coupling wideband RF signals between a balanced transmission line and an unbalanced transmission line according to one exemplary embodiment of the invention.

Referring now to FIG. 14, the figure shows a logical flow diagram representing a method for coupling wideband RF signals between a balanced transmission line and an unbalanced transmission line according to one exemplary embodiment of the invention. Certain steps in the processes or process flow described in all of the logic flow diagrams referred to below must naturally precede others for the invention to function as described. However, the invention is not limited to the order of the steps described if such order or sequence does not alter the functionality of the present invention. That is, it is recognized that some steps may be performed before, after, or in parallel other steps without departing from the scope and spirit of the present invention.

Step 1410 involves propagating an RF signal over an unbalanced transmission line 170. The source of the RF signal can be a signal detector, an antenna, a mixer, an oscillator, another transmission line, a connection to another transmission line, or any other component, device, or system that can be used to feed an RF signal into a transmission line.

In Step 1420, an RF signal is coupled from the unbalanced transmission line 170 into a choke balun 100. The unbalanced transmission line is the same as the transmission line 170 discussed in relation to Step 1410.

In Step 1430, nulls in the RF signal at resonant frequencies of the choke balun 100 are substantially reduced by proving a resistive load 110 within the choke structure 120 of the balun. These undesirable resonances take place at half wavelength multiples of the length of the choke structure. The resistive loading 110 may be provided by resistive cards, vanes, resistive films, a single resistor, an array of resistors, a bulk resistive material, or any other mechanisms for resistively loading the choke structure of the balun. This RF loading can be optimized by modeling software such as High Frequency Structure Simulator (HFSS) or by empirical testing.

In Step 1440, the RF signal is coupled from the choke balun 100 into a balanced transmission line 102. Finally, in Step 1450, the RF signal is propagated along the balanced transmission line 102 mentioned with respect to Step 1440. This balanced transmission line 102 may feed into some balanced load. The load can be a transmitter, antenna, laser, amplifier, another transmission line, a coupling into another transmission line, or any other component, device, or system that an RF signal can be fed into.

Alternative embodiments of the wide band balun system will become apparent to one of ordinary skill in the art to which the present invention pertains without departing from its spirit and scope. Thus, although this invention has been described in exemplary form with a certain degree of particularity, it should be understood that the present disclosure has been made only by way of example and that numerous changes in the details of construction and the combination and arrangement of parts or steps may be resorted to without departing from the spirit or scope of the invention. Accordingly, the scope of the present invention is defined by the appended claims rather than the foregoing description.

What is claimed is:

1. A balun system comprising:

an unbalanced transmission line;

a reactive choke structure comprising a cavity with a resistive load; and a balanced transmission line, wherein the reactive choke structure electrically couples the balanced transmission line to the unbalanced transmission line and the resistive load substantially reduces resonant nulls in the electromagnetic energy passing through the balun by providing electrical resistance at resonant frequencies of the reactive choke structure, the balun supporting the coupling of radio-frequency signals with increased bandwidth between the unbalanced transmission line and balanced transmission line.

2. The balun system of claim 1, wherein the reactive choke structure comprises one or more striplines.

3. The balun system of claim 1, wherein the resistive load comprises one or more resistive film vanes extending from the reactive choke structure to a ground conductor, the vanes disposed substantially parallel to the electric field within and around the reactive choke structure.

4. The balun system of claim 1, wherein the resistive load comprises one or more discrete resistors extending from the reactive choke structure to a ground conductor, the discrete resistors disposed substantially parallel to the electric field within and around the reactive choke structure.

5. The balun system of claim 1, wherein the coupling between the choke and the balanced transmission line comprises a power splitter supporting the coupling of two or more balanced transmission line to the choke.

6. The balun system of claim 1, wherein the reactive choke structure comprises a coaxial choke structure, the choke and unbalanced transmission line both being substantially cylindrical and sharing a common central axis.

7. The balun system of claim 6, wherein the resistive load comprises one or more resistive film vanes extending from the reactive choke structure, radially outward, to a ground conductor, the vanes disposed substantially parallel to the electric field within and around the reactive choke structure.

8. The balun system of claim 6, wherein the resistive load comprises one or more discrete resistors extending from the reactive choke structure, radially outward, to a ground conductor, the discrete resistors disposed substantially parallel to the electric field within and around the reactive choke structure.

9. A balun system comprising:

an unbalanced stripline comprising one conductive trace;

a conductive structure surrounding the conductive trace of the unbalanced stripline to form a choke;

a resistive load element extending from the choke structure; and a balanced stripline comprising two conductive traces coupled to the choke structure, wherein the reactive choke structure electrically couples the balanced stripline to the unbalanced stripline and the resistive load substantially reduces resonant nulls in the electromagnetic energy passing through the balun by providing electrical resistance at resonant frequencies of the choke structure, the balun supporting the coupling of radio-frequency signals with increased bandwidth between the unbalanced stripline and balanced stripline.

10. The balun system of claim 9, wherein the coupling of the balanced stripline to the choke structure comprises the first conductive trace of the balanced stripline extends from the conductive trace of the unbalanced stripline, and the second conductive trace of the balanced stripline extending from the conductive choke structure.

11. The balun system of claim 9, wherein the first conductive trace of the balanced stripline is narrower than the conductive trace of the unbalanced stripline.

12. The balun system of claim 9, wherein a width of the balanced stripline provides impedance matching between the unbalanced stripline and the balanced stripline.

13. The balun system of claim 9, wherein the resistive load element comprises one or more resistive film vanes extending from the choke structure to a ground conductor, the vanes disposed substantially parallel to the electric field within and around the choke structure.

14. The balun system of claim 9, wherein the resistive load element comprises one or more discrete resistors extending from the choke structure to a ground conductor, the discrete resistors disposed substantially parallel to the electric field within and around the choke structure.

15. The balun system of claim 9, wherein the coupling between the choke structure and the balanced transmission line comprises a power splitter supporting the coupling of more than one balanced transmission line to the choke structure.

16. The balun system of claim 9, further comprising a second balanced stripline, the coupling of both balanced striplines to the choke structure comprising a split in the conductive traces of the balanced striplines.

17. The balun system of claim 16, wherein width of the balanced stripline provides impedance matching between the unbalanced stripline and the two balanced striplines.

18. A wideband signal distribution system comprising:

an unbalanced input transmission line;

a plurality of choke baluns with resistive loads coupled to the unbalanced input transmission line; and a plurality of balanced output transmission lines;

wherein the choke baluns electrically couple the balanced transmissions line to the unbalanced transmission line and the resistive loads substantially reduce resonant nulls in the electromagnetic energy passing through the baluns by providing electrical resistance at resonant frequencies of the choke structures, the system supporting the distribution of radio-frequency signals with increased bandwidth between the unbalanced transmission line and the plurality of balanced transmission lines.

19. The signal distribution system of claim 18, wherein the choke baluns comprise a power splitter to support coupling two or more balanced output transmission lines to each choke balun.

20. The signal distribution system of claim 18, wherein the resistive loads comprise one or more resistive film vanes extending from the choke structure to a ground conductor of each balun.

21. The signal distribution system of claim 18 wherein the resistive loads comprise one or more discrete resistors [extending from the choke structure to a ground conductor of each balun.

22. A method for coupling a radio-frequency signal of increased bandwidth between a balanced transmission line and an unbalanced transmission line comprising:

propagating a radio-frequency signal over an unbalanced transmission line;

coupling the unbalanced radio-frequency signal to a choke balun;

substantially reducing nulls in the radio-frequency signal at resonant frequencies of the choke balun with a resistive load disposed within the balun;

coupling the radio-frequency signal at an output of the balun into a balanced transmission line; and propagating the radio-frequency signal along the balanced transmission line.

23. The method of claim 22, further comprising the step of substantially reducing propagation modes in the balanced transmission line that are not transverse electromagnetic modes, the reduced modes being damped by the resistive load disposed within the balun.

24. The method of claim 22, further comprising the step of splitting the output signal from the balun to couple with two or more balanced transmission line outputs.

25. The method of claim 22, further comprising the step of matching the impedance of one or more balanced output transmission lines with the impedance of the resistively loaded balun.

26. The method of claim 22, further comprising the step of feeding a balanced antenna by coupling the antenna to the balanced transmission line.

* * * * *

UNITED STATES PATENT AND TRADEMARK OFFICE

CERTIFICATE OF CORRECTION

PATENT NO. : 7,449,975 B2 
APPLICATION NO. : 11/623554
DATED : November 11, 2008
INVENTOR(S) : John C. Hoover It is certified that error appears in the above-identified patent and that said Letters Patent is hereby corrected as shown below:

Column 9, Claim 5, line 14, “balanced transmission line to the choke.” should read -- balanced transmission lines to the choke. --.

Column 10, Claim 21, line 33, “resistive loads comprise one or more discrete resistors [ex-” should read -- resistive loads comprise one or more discrete resistors ex- --.

Signed and Sealed this

Tenth Day of February, 2009

JOHN DOLL
*Acting Director of the United States Patent and Trademark Office*